US012560641B2

(12) United States Patent
Heinrich et al.

(10) Patent No.: US 12,560,641 B2
(45) Date of Patent: Feb. 24, 2026

(54) METHOD OF MONITORING RELIABILITY OF SYSTEM INCLUDING ELECTRICAL COMPONENTS

(71) Applicant: Aptiv Technologies AG, Schaffhausen (CH)

(72) Inventors: Markus Heinrich, Wiehl (DE); Guillaume Tournabien, Saint Soupplets (FR)

(73) Assignee: Aptiv Technologies AG, Schaffhausen (CH)

( * ) Notice: Subject to any disclaimer, the term of this patent is extended or adjusted under 35 U.S.C. 154(b) by 193 days.

(21) Appl. No.: 18/491,766

(22) Filed: Oct. 21, 2023

(65) Prior Publication Data

US 2024/0151765 A1 May 9, 2024

(30) Foreign Application Priority Data

Oct. 21, 2022 (EP) ..................................... 22203094

(51) Int. Cl.
G01R 31/26 (2020.01)
G01R 31/00 (2006.01)
*G01K 3/08* (2006.01)

(52) U.S. Cl.
CPC ....... *G01R 31/2628* (2013.01); *G01R 31/005* (2013.01); *G01K 3/08* (2013.01)

(58) Field of Classification Search
CPC .. G01R 31/2628; G01R 31/005; G01R 31/00; G01R 31/003; G01R 31/2642; G01R 31/2601; G01R 31/2619; G01K 3/08; G01K 3/005; G01K 7/42; G06F 30/20; G06F 2119/08; G06F 30/367; G06F 2119/02;

(Continued)

(56) References Cited

U.S. PATENT DOCUMENTS 8,076,967 B2 12/2011 Jacobson
8,436,600 B2 5/2013 Pelz
(Continued)

FOREIGN PATENT DOCUMENTS

CN 100420130 C 7/2005
CN 100420139 C 3/2006
(Continued)

OTHER PUBLICATIONS

J. Schönberger, "Thermal simulation of power electronic systems," IET Seminar on Power Electronics 2010: Improving the Efficiency of the Power Grid, Birmingham, 2010, pp. 1-39 relates to thermal simulation of various power electronic systems (Year: 2010).*

(Continued)

*Primary Examiner* — Daniel R Miller
(74) *Attorney, Agent, or Firm* — Miller Johnson

(57) ABSTRACT

A system includes at least one electrical component. A method of monitoring reliability of the system includes receiving input data including electrical characteristics of the at least one electrical component. The method includes processing the input data using a stored thermal model representing heat transfer for the at least one electrical component to determine temperature information of the at least one electrical component. The method includes monitoring the reliability of the system using the determined temperature information.

14 Claims, 3 Drawing Sheets

(58) Field of Classification Search

CPC .. G06F 2119/04; G06F 2119/06; G06F 30/23; G06F 1/206; G06F 2111/10

See application file for complete search history.

(56) References Cited

U.S. PATENT DOCUMENTS

| | | | |
|---|---|---|---|
| 8,559,151 | B2 | 10/2013 | Huber |
| 10,742,017 | B2 | 8/2020 | Morimoto |
| 10,955,297 | B2 | 3/2021 | Wang |
| 2005/0014307 | A1 | 1/2005 | Shiraishi et al. |
| 2009/0276165 | A1* | 11/2009 | Weiss ..................... H02P 27/00 |
| | | | 702/34 |
| 2018/0332200 | A1 | 11/2018 | Sesti |
| 2020/0192050 | A1 | 6/2020 | Li et al. |
| 2020/0235731 | A1 | 7/2020 | Wang et al. |
| 2021/0226444 | A1 | 7/2021 | Fang et al. |
| 2022/0018720 | A1* | 1/2022 | Tulane ..................... G01K 7/22 |
| 2022/0065924 | A1 | 3/2022 | Barrenscheen et al. |

FOREIGN PATENT DOCUMENTS

| | | | |
|---|---|---|---|
| CN | 101777501 B | 4/2012 | |
| CN | 111783287 A * | 10/2020 | ............. G06F 30/20 |
| EP | 749208 A2 | 12/1996 | |
| EP | 3745355 A1 | 12/2020 | |
| WO | 2019146691 A1 | 8/2019 | |
| WO | WO-2020025220 A1 * | 2/2020 | ............. H02M 1/32 |
| WO | WO-2020108172 A1 * | 6/2020 | ............. G06F 17/15 |
| WO | 2019142834 A1 | 1/2022 | |

OTHER PUBLICATIONS

K. Wei, W. Wang, Z. Hu and M. Du, "Condition Monitoring of IGBT Modules Based on Changes of Thermal Characteristics," in IEEE Access, vol. 7, pp. 47525-47534, 2019 (Year: 2019).*

Junction temperature, available at https://en.wikipedia.org/wiki/Junction_temperature on Aug. 11, 2022 (Year: 2022).*

Extended European Search Report for EP App. No. 19948475.9, dated May 23, 2023, 10 pages.

Rufael Mokuria, Point Cloud Compression Tutorial, IEEE Visual Communications and Image Processing 2017, dated 2017, 86 pages.

* cited by examiner

METHOD OF MONITORING RELIABILITY OF SYSTEM INCLUDING ELECTRICAL COMPONENTS

CROSS-REFERENCE TO RELATED APPLICATIONS

This application claims priority to EP App. No. 22 203 094 filed Oct. 21, 2022, the entire disclosure of which is incorporated by reference.

FIELD

The present disclosure relates to the field of monitoring reliability of a system including one or more electrical components, such as a system including a transistor (for example, a MOSFET) used as a switch to power on or off a load from a power source.

BACKGROUND

A transistor such as a MOSFET may be used as a switch to power on or off a load from a power source.

The MOSFETs are likely to have failures in use. These failures are often attributed to over voltage, over current, over temperature etc. . . . In operation, the temperature of the transistor may increase. When a critical temperature is reached, the transistor should be turned off to avoid any damage.

To protect the MOSFET against overheating, it is known to use an intelligent MOSFET including a temperature protection circuitry normally present on a printed circuit board on which the MOSFET is mounted. In an intelligent MOSFET with temperature protection, a temperature sensor is sitting on a die or semiconductor part of the MOSFET. This temperature sensor can measure very fast the temperature. If the temperature sensor is alternatively mounted on the PCB, a fast temperature increase cannot be detected.

However, it is also desired to monitor the reliability of standard MOSFETs and protect them against overheating by quickly detecting any temperature increase. More generally, it is desired to monitor the reliability of a system including a plurality of electrical components.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

The present disclosure concerns a method of monitoring reliability of a system including at least one electrical component, including the steps of:

receiving input data including electrical characteristics of at least one electrical component;

processing the input data using a stored thermal model representing heat transfer for at least one electrical component to determine a temperature information of at least one electrical component; and monitoring the reliability of the system using the determined temperature information.

Thanks to the present disclosure, a temperature information of the one or more electrical components of the system can be determined from the electrical characteristics of the electrical components, using thermal models representing heat transfer for these electrical components.

In an embodiment, the step of receiving input data may include the step of receiving at least one of a measured voltage across at least one electrical component and a measured current flowing through at least one electrical component.

In an embodiment, the step of processing the input data may include a step of estimating an electrical power dissipated by at least one electrical component.

The temperature information of an electrical component can be determined based on the power dissipated by the electrical component, through the thermal modal of this electrical component.

In the step of processing the input data, the determined temperature information may include a temperature difference of at least one electrical component relative to a reference temperature. The present method allows to determine a temperature difference between a first point of the electrical component, where the temperature is to be monitored, and a second point near the electrical component, where an ambient temperature is known, based on a thermal model representing how heat is transferred from the first point to the second point.

In another embodiment, the steps of receiving and processing input data are performed iteratively to determine, at each iteration, a value of an incremental temperature variation of at least one electrical component relative to the reference temperature, over a time step, and the step of processing further includes accumulating the successive values of incremental temperature variation to estimate a value of temperature difference of at least one electrical component relative to the reference temperature.

At each iteration, an incremental variation of the temperature of the electrical component relative to the ambient temperature is determined by processing the input data using the thermal model. Then, the successive values of temperature increments are cumulated to determine, at each time, the difference between the temperature of the electrical component and the ambient temperature.

In an embodiment, the method may further include a step of estimating, at each iteration, an electrical resistance value of at least one electrical component based on the reference temperature and the determined value of temperature difference of at least one electrical component relative to the reference temperature. At each iteration, the temperature difference of the electrical component relative to the ambient temperature can be determined. Then, the electrical resistance value of the electrical component can be updated based and the ambient temperature and temperature difference of the electrical component.

Advantageously, the estimated value of the electrical resistance of at least one electrical component is used as input data at the next iteration in the step of processing input data to determine the temperature information of at least one electrical component. The updated value of the electrical resistance of the electrical component can be used at the next iteration to determine more precisely the temperature information.

In an embodiment, the processing step further includes a step of estimating, at each iteration, an electrical current value flowing through at least one electrical component from a measured voltage value across at least one electrical component and the determined electrical resistance value of at least one electrical component. This allows to precisely determine the electrical current flowing through the electrical component, based on the electrical resistance of the electrical component updated based on the temperature information of the electrical component.

In an embodiment, the system including a plurality of electrical components:

a first processing step is performed for a first electrical component of the system to determine the temperature information of the first electrical component and estimate an electrical current value based on the determined temperature information of the first electrical component, and then a second processing step is performed for a second electrical component of the system to determine the temperature information of the second electrical component, the input data for the second processing step including the estimated electrical current value from the first processing step.

In an embodiment, at least one electrical component may be mounted on a printed circuit board, PCB, and the step of receiving the input data may further include receiving a measured temperature from a sensor mounted on the printed circuit board, to obtain the reference temperature.

In another embodiment, the step of receiving the input data further includes retrieving from memory a prestored maximal ambient temperature that is expected near at least one electrical component, to obtain the reference temperature.

Advantageously, the method may further include a step of comparing an output data from the processing step performed for at least one electrical component with a threshold value to detect an abnormality in the system, and a step of turning off the system or triggering an alert when an abnormality in the system is detected.

The present disclosure also concerns:

a computer program including instructions that, when the program is executed by a processor, cause the processor to carry out the steps of the method previously defined;

a monitoring device configured to monitor reliability of at least one electrical component of a system, including a memory storing predefined thermal characteristics of at least one thermal model representing heat transfer for at least one electrical component of the system;

a processor adapted to perform the steps of the method previously defined.

a monitoring device configured to monitor reliability of at least one electrical component of a system, including only hardware means adapted to perform the steps of the method previously defined;

a vehicle including a monitoring device as above defined.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

The present disclosure concerns a method of monitoring reliability of one or more electrical components ECn of a system 100, with n=1, 2, . . . .

Figure 1:
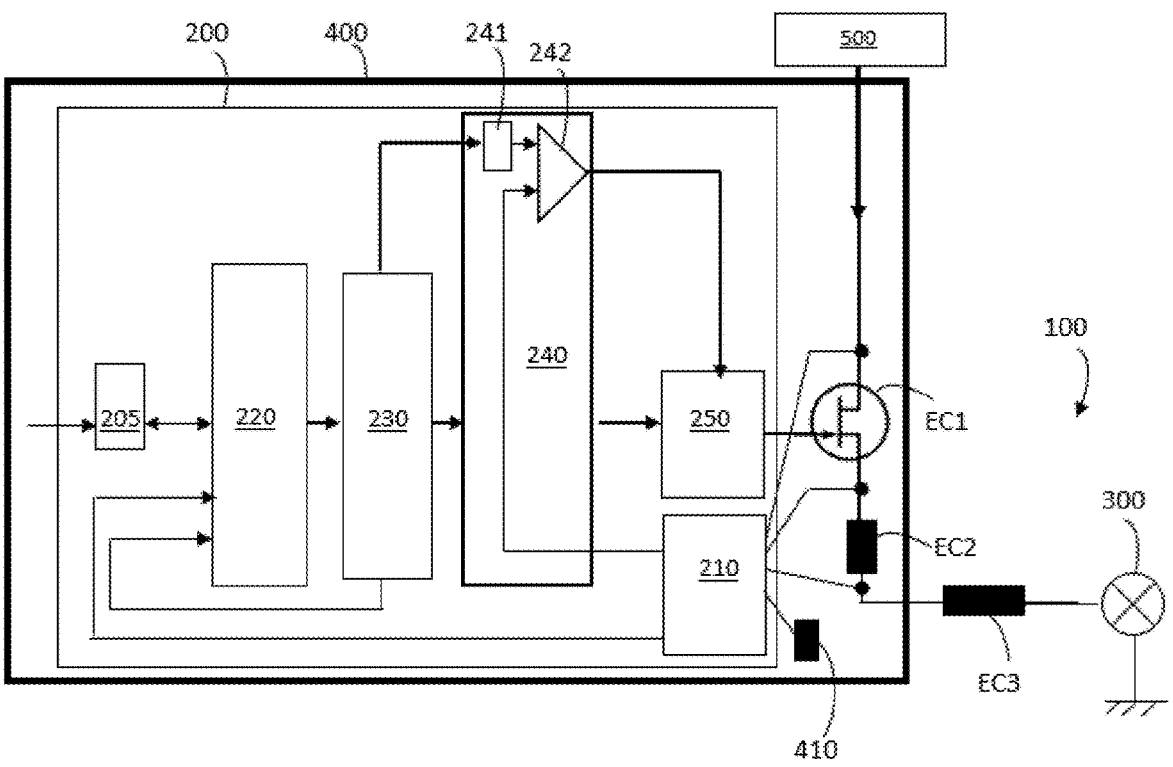
FIG. 1 shows a global system for monitoring reliability of a system including a plurality of electrical component.

A particular embodiment of the system 100 is illustrated in FIG. 1 and includes a transistor EC1 having the function of switching on or off a load 300 from a power source 500, and an interface connecting the transistor $EC_1$ to the load 300. The transistor EC1 may be a FET, for example a MOSFET. The interface may include an electrical shunt EC2, for example a copper shunt, and an electrical cable EC3. The transistor EC1 may be mounted on a printed circuit board, the copper shunt EC2 may be a copper track of the PCB, 400. The electrical cable EC3 may be external to the printed circuit board 400 and connect the shunt EC2 and the load 300.

In operation, the temperature of the electrical components ECn of the system 100 may vary over time, for example due to power loss. The present method allows to determine a temperature information of the electrical components ECn of the system 100 and monitor the reliability of these electrical components ECn using the determined temperature information. For each electrical component ECn of the system 100, the temperature information is determined by processing input data, that includes electrical characteristics of the electrical component ECn, using a stored thermal model representing heat transfer for the electrical component ECn. The electrical characteristics of the electrical component ECn used as input data to determine the temperature information of the electrical component ECn can include a voltage across the electrical component ECn, a current flowing through the electrical component ECn, and/or an electrical resistance value of the electrical component ECn.

The thermal model related to an electrical component ECn having an electrical power consumption $P_n$ represents heat transfer for the electrical component ECn. The heat transfer refers to the heat flow between two given points including a first point of the electrical component ECn, where the temperature is to be estimated, and a second point, where a temperature referred as a reference or ambient temperature Ta is known, for example by measurement. The second point is for example a point of the printed circuit board 400 on which a temperature sensor 410 is mounted. In another example, the ambient temperature Ta may be the air temperature around the cable EC3.

Figure 2:
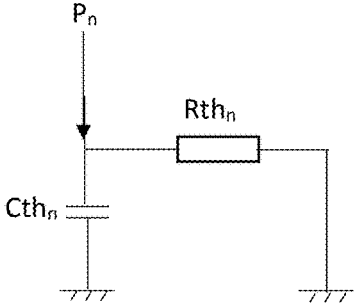
FIG. 2 shows a first order Cauer thermal model.

In an embodiment, the thermal model is a Cauer thermal model, for example a first order Cauer thermal model having a simple structure as represented by an equivalent circuit in FIG. 2, including a thermal capacitance $Cth_n$ and a thermal resistance $Rth_n$ of the electrical component ECn, both connected in parallel between a power supply point, provided with the electrical power $P_n$, and the ground. The thermal resistance $Rth_n$ is a quantification of how difficult it is for heat to be conducted between the two given points. The thermal capacitance $Cth_n$ is a quantification of how quickly heat is conducted between the two given points. The thermal modal could be a Cauer model with higher order. In that case, the Cauer model just needs additional calculations after first order is determined.

The electrical power $P_n$ consumed or dissipated by the electrical component ECn can be determined from measurements of a voltage $V_n$ across the electrical component and/or a current $I_n$ flowing through the electrical component ECn. As well-known by the skilled person, the electrical power $P_n$ dissipated by the electrical component ECn can be expressed by any of the following equations:

$$P_n = \frac{V_n^2}{R_n} \tag{1}$$

$$P_n = I_n \cdot V_n \tag{2}$$

$$P_n = I_n^2 \cdot R_n \tag{3}$$

In an embodiment, the measurements of electrical characteristic(s) are sampled or performed at successive times $t_i$, with i=1, 2, 3, . . . , every time step dt. For example, the time step dt may be of the order of a few hundred microseconds. A temperature information of the electrical component ECn such as a temperature variation or difference relative to the reference or ambient temperature Ta can be determined using the thermal model. The temperature Ta may be measured by a sensor near the electrical component ECn, for example the temperature sensor 410 mounted on the printed circuit board 400.

In case the thermal model is the first order Cauer thermal model represented in FIG. 2, an incremental temperature variation, or temperature increment, of the electrical component ECn relative to the ambient temperature Ta over the time set dt can be expressed by the following equation:

$$\Delta T_{n,i} = \frac{dt}{Cth_n} \cdot \left( P_n(t_i) - \frac{dT_{n,i-1}}{Rth_n} \right) \tag{4}$$

where $\Delta T_{n,i}$ represents the incremental temperature variation or temperature increment between a first point of the electrical component ECn, where the temperature needs to be estimated, and a second point at the ambient temperature Ta;

dt represents the time step or sampling period;

$Cth_n$ and $Rth_n$ represent the thermal capacitance and thermal resistance of the material responsible for transferring heat from the first point to the second point;

$P_n(t_i)$ represents the electrical power dissipated by the electrical component ECn at time $t_i$;

$dT_{n,i-1}$ represents the temperature difference between the first point and the second point at time $t_{i-1}$.

Furthermore, a temperature difference of the electrical component ECn relative to the ambient temperature Ta can be estimated by accumulating the successive values of incremental temperature variation and thus calculating a cumulated temperature variation or difference, expressed by the following equation:

$$dT_{n,i} = dT_{n,i-1} + \Delta T_{n,i} \tag{5}$$

where $\Delta T_{n,i}$ represents the temperature variation or increment of the electrical component ECn between the successive times $t_{i-1}$ and $t_i$;

$Rth_n$ and $Cth_n$ represent the thermal resistance and thermal capacitance related to the electrical component ECn, respectively;

dt represents the time step between two sampling times or two iterations;

$P_n(t_i)$ represents the electrical power dissipated by the electrical component ECn at the sampling time $t_i$;

$dT_{n,i-1}$, $dT_{n,i}$ represent the values of temperature difference of the electrical component ECn relative to the ambient temperature Ta at the times $t_{i-1}$ and $t_i$, respectively.

Any other type of thermal modal could be used for modelling heat transfer through the electrical component.

Due to the temperature variation over time of the electrical components of the system 100, some electrical characteristics of the system 100 may also vary over time. For example, the electrical resistance value of an electrical component ECn may vary over time due to a temperature variation of this electrical component ECn. Consequently, an electrical current flowing through this electrical component ECn may vary over time. The present method allows to determine and update over time the values of electrical characteristics of the system 100 that are temperature dependent, as explained later in more detail.

The method of monitoring reliability of the system 100 may be carried out by a monitoring device 200. In an embodiment, the monitoring device 200 is mounted on the printed circuit board 400. The monitoring device 200 includes an input interface 205, a measurement module 210, a memory system 220, a processing module 230, and a diagnostic module 240. The monitoring device 200 may also include a controlling module 250 configured to control the transistor EC1.

The monitoring device 200 may be implemented with hardware and software. For example, the monitoring device 200 may include a processor, not represented in FIG. 1, and software or computer programs or applications configured to run on the processor.

The input interface 205 is a user interface configured to exchange information between the system 100 and a user, and to switch on and off the transistor EC1.

The measurement module 210 is configured to measure voltage across the transistor EC1 and across the shunt EC2 and acquire the temperature measured by the temperature sensor 410. The measurement module 210 may include one or more amplifier(s) to amplify low measurement values to higher values, and one or more analog to digital converter(s) to convert analog measured values to digital data and transmit the digital data to the memory system 220.

In an embodiment, the memory system 220 may include:

a nonvolatile memory storing predefined thermal and electrical parameters related to the electrical components ECn of the system 100, a first buffer memory configured to store values of temperature and electrical characteristics, such as a voltage, transmitted by sensors, a second the buffer memory configured to store output data resulting from processing input data by the processing module 230, as described below in more detail.

The processing module 230 is configured to receive or acquire input data including electrical characteristics of the electrical components ECn of the system 100. The processing module 230 is further configured to process the input data using stored thermal models representing heat transfer for the electrical components ECn respectively, to determine a temperature information of the electrical components ECn. The processing module may further be configured to determine temperature-dependent electrical characteristics of the electrical components ECn, such as a resistance and/or a current, using the determined temperature information. The processing module 230 may include a processor.

The diagnostic module 240 is configured to monitor the reliability of the system 100 using the determined temperature information of the electrical components ECn and/or the electrical characteristics of the electrical components ECn determined based on the determined temperature information, as will be described in more detail in the description of the method.

Figure 3:
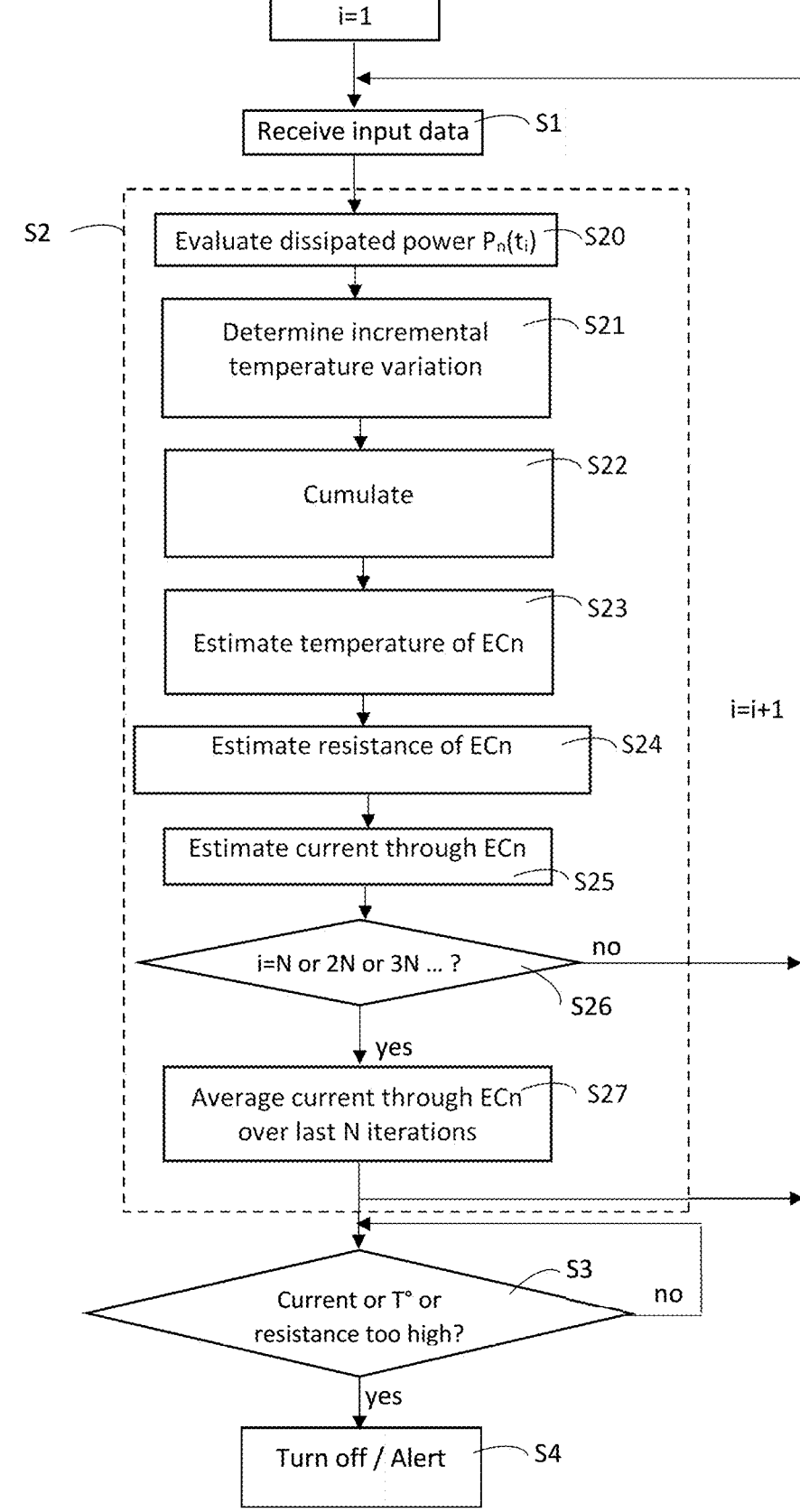
FIG. 3 represents a flow chart of the method of monitoring reliability of a system including one or more electrical components, according to an embodiment.

An embodiment of the method of monitoring reliability of one or more electrical components ECn of the system 100 is illustrated in FIG. 3 and will now be described. The method is performed by the monitoring device 200.

Let's consider the electrical component ECn of the system 100. The method may include an iterative process performed at successive times $t_1$, $t_2$, $t_3$, . . . , or sampling times, for the electrical component ECn. At each iteration of time $t_i$ with i≥1, the iterative process includes:

a step S1 of receiving input data including electrical characteristics of the electrical component ECn;

a step S2 of processing the input data using a stored thermal model representing heat transfer for the electrical component ECn to determine a temperature information of the electrical component.

The steps S1 and S2 can be performed by the processing module 230.

In the first step S1, the processing module 230 receives or acquires input data.

The input data includes electrical characteristics of the electrical component ECn.

The electrical characteristics of the electrical component ECn may include a voltage $V_n(t_i)$ across the electrical component ECn, and/or a current $I_n(t_i)$ flowing through the electrical component ECn. The voltage $V_n(t_i)$ across the electrical component ECn or the current $I_n(t_i)$ flowing through the electrical component ECn may be obtained by or derived from measurement performed at time $t_i$.

In an embodiment, the voltage $V_n(t_i)$, or current $I_n(t_i)$, of the electrical component ECn is measured by the measurement module 210 and transmitted to the monitoring device 200.

In another embodiment, the current $I_n(t_i)$ flowing through the electrical component ECn is estimated by first performing the iterative process including the steps S1 and S2 for another electrical component ECn' of the system 100, based on a temperature information of ECn'. For example, the current flowing through the transistor EC1 and the cable EC3 can be first estimated through the shunt EC2, based on a temperature information of the shunt EC2 determined by performing the iterative process S1-S2 for the shunt EC2, as described later in more detail.

The input data may further include a value of an electrical resistance $R_n(t_i)$ of the electrical component ECn. In case this electrical resistance is temperature dependent, the value of the electrical resistance $R_n(t_i)$ used as input data at each iteration of the process can correspond to the value of the electrical resistance $R_n(t_{i-1})$ determined at the previous iteration of the process, as explained later in more detail.

The input data may further include an ambient temperature Ta near the electrical component ECn. This ambient temperature Ta may be measured at each time $t_i$ by a sensor near the electrical component ECn, such as the temperature sensor 410 mounted on the printed circuit board 400, and transmitted to the monitoring device 200 in the step S1, via the measurement module 210. In another embodiment, if there is no sensor to measure the ambient temperature Ta, this ambient temperature Ta may be set to a maximal ambient temperature that can be expected, prestored in the nonvolatile memory of the memory system 220. In that case, the processing module 230 retrieves from memory the ambient temperature Ta in the step S1.

The input data may further include prestored constant values of thermal and/or electrical parameters of the electrical component ECn, such as the thermal resistance Rth and thermal capacitance Cth of the material responsible for heat transfer for the electrical component ECn, a temperature coefficient $\alpha_n$ of the electrical component ECn, and a reference electrical resistance value of the electrical component ECn at room temperature, for example 20° C. The temperature coefficient $\alpha_n$ of the electrical component ECn represents a temperature dependency of the electrical resistance of the electrical component ECn. These constant values may be prestored in the non-volatile memory of the memory system 220 and retrieved from memory by the processing module 230 in the step S1, when needed.

In a step S2, the processing module 230 processes the input data using the stored thermal model representing heat transfer for the electrical component ECn to determine a temperature information of the electrical component ECn. The temperature information may include an estimated variation or difference of temperature between a temperature of the electrical component ECn and the ambient temperature Ta, and/or an estimated temperature of the electrical component ECn. The processing step S2 may include at least part of the steps S20 to S27 described below.

The step S2 may include a step S20 of evaluating the electrical power $P_n(t_i)$ dissipated by the electrical component ECn during the current time step dt, by processing the input data acquired at the step S1, based on one of the equations (1) to (3).

Then, in a step S21, the processing module 230 may compute the value $\Delta T_{n,i}(t_i)$ of incremental temperature variation of the electrical component ECn relative to the ambient temperature Ta over the current time step dt, between times $t_i$ and $t_{i+1}$ based on the thermal model, for example with the equation (4).

The step S2 may further include a step S22 of determining the value $dT_{n,i}$ of cumulated or global temperature variation of the electrical component ECn relative to the ambient temperature Ta between the initial time to and the current time based on the equation (5). The iterative step S22 allows to accumulate successive values of incremental temperature variation of the electrical component ECn relative to the ambient temperature Ta.

The step S2 may also include a step S23 of estimating the temperature of the electrical component ECn based on the ambient temperature Ta and the temperature difference $dT_{n,i}$ based on the following equation:

$$T_n(t_i)=Ta+dT_{n,i} \qquad (6)$$

where $T_{n,i}(t_i)$ is the estimated temperature of the electrical component ECn at time $t_i$;

Ta is the ambient temperature near the electrical component ECn;

$dT_{n,i}$ is the temperature difference of the electrical component ECn relative to the ambient temperature Ta.

In case the electrical component ECn has an electrical resistance that is temperature dependent, the processing step S2 further includes a step S24 of estimating an electrical resistance value of the electrical component ECn at time $t_i$, based on a predetermined reference electrical resistance value $R_{ref,n}$ of the electrical component ECn, a predetermined temperature coefficient $\alpha_n$ of the electrical component ECn, the ambient temperature Ta and the value $dT_{n,i}$ of temperature difference of the electrical component ECn determined at the step S22. The reference electrical resistance value $R_{ref,n}$ may be the electrical resistance value of the electrical component ECn at room temperature, for example 20° C. The temperature coefficient $\alpha_n$ is a predetermined constant parameter of the electrical component ECn. The parameters $R_{ref,n}$ and $\alpha_n$ are prestored in the memory system 220. In the step S24, the electrical resistance value of the electrical component ECn at time $t_i$ may be evaluated based on the following equation:

$$R_n(t_i)=R_{ref,n}+\alpha_n\cdot(Ta+dT_{n,i}-T_0) \qquad (7)$$

where $R_{ref,n}$ is the reference electrical resistance value of the electrical component ECn at the room or reference temperature $T_0$, for example $T_0$=20° C.;

$\alpha_n$ is the temperature coefficient an of the electrical component ECn;

Ta is the ambient temperature near the electrical component ECn;

$dT_{n,i}$ is the temperature difference of the electrical component ECn relative to the ambient temperature Ta.

The electrical resistance value $R_n(t_i)$ of the electrical component ECn determined at the iteration of time $t_1$ can be used at the next iteration of time $t_{i+1}$ to estimate the power dissipated by the component ECn based on the equation (1) or (3).

In an embodiment, the processing step S2 may further include a step S25 of estimating a value of the electrical current $I_n(t_i)$ flowing through the electrical component ECn, for example based on the voltage value $V_n(t_i)$ across the electrical component ECn received in the step S1 and the electrical resistance value $R_n(t_i)$ of the electrical component ECn estimated at the step S24, based on the equation:

$$I_n(t_i) = \frac{V_n(t_i)}{R_n(t_i)} \qquad (8)$$

In an optional step S27, the current flowing through the electrical component ECn can be averaged over a time window or cycle including N iterations of the process, and having a length N*dt (in other words, over N successive time steps dt). For example, an average value of the current $I_n(t_i)$ may be determined periodically or cyclically, every N iterations of the process, here at time $t_N$, $t_{2N}$, $t_{3N}$, . . . , each cycle including N consecutive iterations of the step S25. During each cycle, the current $I_n(t_i)$ can be summed up until the N iterations of the step S25 of the cycle have been executed, in other words over N successive iterations. At the end of each cycle of N consecutive iterations, in a step S26, the sum of the N successive current values estimated in the step S25 over the N iterations is divided by N to determine the averaged current $\tilde{I}_n$ . The average current at time $t_i$ for i=N, 2N, 3N, . . . can be expressed by the following equation:

$$\tilde{I}_n(t_{xN}) = \frac{\sum_{(x-1)N+1}^{xN} I_n(t_i)}{N}, \text{ with } x = 1, 2, 3, \qquad (9)$$

In this way, the average current is updated every N measurements, or every N iterations of the process.

Averaging allows to reduce noise. The current value may be more accurate with averaging.

If N is a power of 2, namely $N=2^q$, dividing the sum of N successive current values can be easily done by shifting q bits in a bit register storing the sum in binary form.

The estimated value of the electrical current $I_n$ or $\tilde{I}_n$ flowing through the electrical component ECn can be used as input data in the steps S1 and S2 for another electrical component having the same electrical current flowing through it.

The output data of the processing step S21 performed for the electrical component ECn may include at least part of the following values:

the cumulated or global temperature variation $dT_{n,i}$ of the electrical component ECn relative to the ambient temperature Ta;

the estimated temperature $T_n(t_i)$ of the electrical component ECn;

the estimated electrical resistance value $R_n(t_i)$ of the electrical component ECn;

the estimated value $I_n(t_i)$ or average value $\tilde{I}_n(t_i)$ of the electrical current flowing through the electrical component ECn.

The above list of output data is not exhaustive. Other values of thermal or electrical characteristics of the electrical component ECn could be derived from one of the above listed output values and provided at the output of the processing step S2.

The output of the processing step S2 at time $t_i$ may be used as input data for the processing step S2 performed at time $t_{i+1}$.

The method further includes a step S3 of monitoring the reliability of the electrical component ECn based on the output data of the processing step S2. The step S3 can be performed by the diagnostic module 240. One or more pieces of the output data of the processing step S2 may be compared to threshold values prestored for example in the non-volatile memory of the memory system 220 to detect an abnormality in the system 100. The detected abnormalities may include for example:

a temperature that is too high;

a resistance that is too high;

a current that is too high.

In case an abnormality in the system 100 is detected in the step S3, a step of turning off the system 100, or at least one electrical component of the system 100, and/or triggering an alert may be performed, in a step S4.

The iterative process including the steps S1 and S2 is performed at successive times every time step dt, and for each electrical component ECn of the system 100 that is monitored.

As an illustrative example, the process performed for each of the electrical components of the system in FIG. 1, including the transistor EC1, the shunt EC2, and the cable EC3, will now be described. It includes, for each component EC1, EC2 or EC3, the steps of the method previously described and illustrated in FIG. 3. The method steps will be denoted with the suffix _EC1, or _EC2, or _EC3, corresponding to the component for which the method is implemented.

In an embodiment, the process is first performed for the shunt EC2 to estimate the current flowing through the transistor EC1, the shunt EC2 and the cable EC3. The estimated current is then used as an input data in the process performed for the transistor EC1 and the cable EC3.

Figure 4:
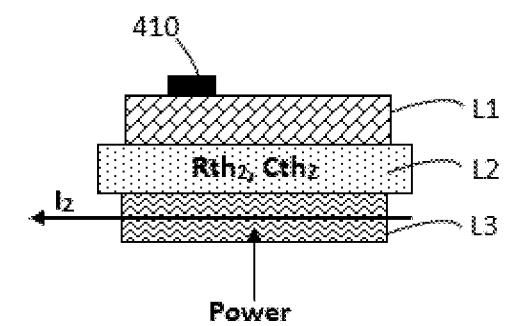
FIG. 4 schematically represents an electrical shunt of the system of FIG. 1.

The shunt EC2 is mounted on the printed circuit board 400. It is a kind of track, for example made of copper. The shunt EC2 is a device used to measure an electrical current $I_2$ that flows through the shunt EC2. FIG. 4 schematically illustrates a model for the shunt EC2 including a copper outer layer L1, where the temperature is detected with the sensor 410, a copper inner layer L3, through which a current $I_2$ flows, and an insulation layer L2, called "pre-preg", interposed between the outer layer L1 and the inner layer L3.

The iterative process includes the following steps S1_EC2 and S2_EC2 executed for the shunt EC2.

In the acquisition step S1_EC2, at each iteration of time $t_i$, the processing module 230 acquires the following values:

a value of the voltage $V_2(t_i)$ across the shunt EC2 at time $t_i$ measured by the measurement module 210;

a value of the ambient temperature $Ta(t_i)$ measured at time $t_i$ by the temperature sensor 410 mounted on the printed circuit board 400, prestored parameters including the thermal resistance Rth2 and thermal capacitance Cth2 of the material responsible for heat transfer from the inner layer L3 to the outer layer L1, a reference value $R_{ref,2}$ of the electrical resistance of the shunt EC2 at room or reference temperature $T_0$ of 20° C., a temperature coefficient $\alpha_2$ of the shunt EC2, a value of the electrical resistance of the shunt EC2 estimated at the previous iteration of time $t_{i-1}$, a cumulated or global temperature variation $dT_{2,i-1}$ of the shunt EC2 relative to the ambient temperature Ta estimated at the previous iteration of time $t_{i-1}$.

In the processing step S2_EC2, at each time the processing module 230 processes the input data using the thermal model. The processing includes the steps S20_EC2 to S27_EC2 described below.

In the step S20_EC2, the processing module 230 estimates an electrical power dissipated by the shunt EC2 based on the measured value of the voltage $V_2(t_i)$ across the shunt EC2 and the value of the electrical resistance of the shunt EC2 estimated at the previous iteration of time $t_{i-1}$, using the following equation:

$$P_2(t_i) = \frac{(V_2(t_i))^2}{R_2(t_{i-1})} \tag{10}$$

At an initial time $t_0$, the value of the electrical resistance of the shunt EC2 may be set to the reference resistance value $R_{ref,2}$ of the shunt EC2 at room temperature.

In the step S21_EC2, the processing module 230 estimates a value $\Delta T_{2,i}$ of incremental temperature variation of the shunt EC2 relative to the ambient temperature Ta over the current time step dt, between times $t_i$ and $t_{i+1}$, based on the thermal model, using the following equation derived from the equation (4):

$$\Delta T_{2,i} = \frac{dt}{Cth_2} \cdot \left( P_2(t_i) - \frac{dT_{2,i-1}}{RTh_2} \right) \tag{11}$$

In the step S22_EC2, the processing module 230 determines a value $dT_{2,i}$ of temperature difference of the shunt EC2 relative to the ambient temperature Ta. For that purpose, the processing module 230 computes the cumulated temperature variation between the initial time to and the current time by adding $\Delta T_{2,i}$ to the value of temperature difference $dT_{2,i-1}$ of the shunt EC2 relative to the ambient temperature Ta determined at the previous iteration of time $t_{i-1}$, based on the equation (5).

In the step S23_EC2, the processing module 230 may estimate the temperature of the shunt EC2 based on the ambient temperature $Ta(t_i)$, that is the temperature on the printed circuit board 400 measured by the sensor 410, and the value of temperature difference $dT_{2,i}$ based on the following equation derived from the equation (6):

$$T_2(t_i) = Ta(t_i) + dT_{2,i} \tag{12}$$

In the step S24_EC2, the processing module 230 estimates the value of the electrical resistance of the shunt EC2 at time $t_i$, based on the following equation:

$$R_2(t_i) = R_{ref,2} + \alpha_2 \cdot (Ta(t_i) + dT_{2,i} - 20) = R_{ref,2} + \alpha_2 \cdot (T_2(t_i) - T_0) \tag{13}$$

$\alpha_2 = 0$ if the shunt resistance is not temperature dependent.

In the step S25_EC2, the processing module 230 estimates the electrical current $I_2(t_i)$ flowing through the shunt EC2 based on the voltage value $V_2(t_i)$ measured across the shunt EC2 and the electrical resistance value $R_2(t_i)$ of the shunt EC2 estimated at the step S24, based on the equation:

$$I_2(t_i) = \frac{V_2(t_i)}{R_2(t_i)} \tag{14}$$

Optionally, in the step S27_EC2, the current flowing through the shunt EC2 may be averaged every N iterations of the process. For that purpose, the current $I_2(t_i)$ can be summed up until the N iterations of the step S25_EC2 have been executed during each cycle of N consecutive iterations. At the end of each cycle of N iterations, at i=N, 2N, 3N, . . . , the sum of the N successive current values $I_2(t_i)$ is then divided by N to determine the average current $\tilde{I}_2$. The average current at time $t_N$, $t_{2N}$, $t_{3N}$, . . . , can be expressed by the following equation:

$$\tilde{I}_2(t_{xN}) = \frac{\sum_{(x-1)N+1}^{xN} I_2(t_i)}{N}, \text{ with } x = 1, 2, 3, \tag{15}$$

Optionally, a step S3 of monitoring the output of the processing step S2 may be performed for the shunt EC2. For example, the diagnostic module 240 may compare the temperature difference $dT_{2,i}$, and/or the temperature $T_2(t_i)$, and/or the current $I_2(t_i)$, and/or the averaged current $\tilde{I}_2(t_i)$, to respective thresholds, so as to detect an abnormality in the system 100. When an abnormality is detected, the transistor EC1 may be turned off and/or an alert may be triggered.

In an embodiment, the diagnostic module 240 may include an analog comparator 242 configured to quickly detect that the current $I_2$ flowing through the shunt EC2 exceeds a maximal value of current, prestored in the non-volatile memory of the memory system 220, and denoted as $Ids_{max}$. The maximal current $Ids_{max}$ may be the maximal drain-source current allowed through the transistor EC1. For example, the analog comparator may be a voltage comparator configured to receive in input a maximal analog voltage $V_{2max}(t_i)$ through the shunt EC2 and the measured voltage through the shunt EC2, at each time $t_i$. The maximal analog voltage $V_{2max}(t_i)$ can be determined by computing $V_{2max}(t_i) = Ids_{max} \cdot R_2(t_i)$ by the processing module 230 and converting the computed digital value into an analog value by a digital to analog converter DAC 241. The output of the comparator 242 is connected to the controlling module 250. In case the current $I_2$ exceeds the maximal value of current $Ids_{max}$, the comparator 242 transmits to the controlling module 250 a signal indicative of a peak of current that is too high. In an embodiment, upon receiving this signal, the controlling module 250 turns off the transistor EC1.

Figure 5:
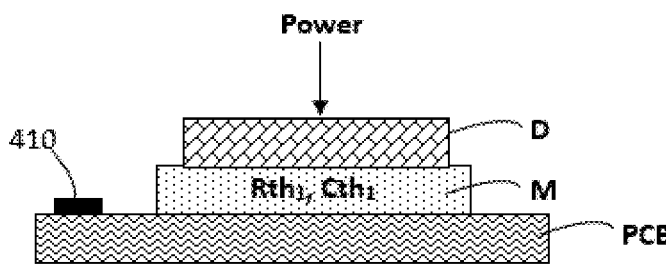
FIG. 5 schematically represents a transistor of the system of FIG. 1.

The transistor EC1 is mounted on the printed circuit board 400. The transistor EC1 is a device used to switch on or off the load 300. FIG. 5 schematically illustrates a model for the transistor EC1 including: a first layer D representing a die or semiconductor part of the transistor EC1, that receives the electrical power $P_1$, a second layer M representing a metal material conducting heat, a third layer PCB representing the printed circuit board 400, where the ambient temperature is detected with the sensor 410. For example, the transistor EC1 is a MOSFET. The MOSFET has three terminals: drain, gate and source. The electrical power $P_1$ supplied to the MOSFET can be expressed by the following equation:

$$P_1 = I_{ds} \cdot V_{ds} \tag{16}$$

where $I_{ds}$ is the drain source current of the MOSFET;

$V_{ds}$ is the drain source voltage of the MOSFET.

In the acquisition step S1_EC1, at each iteration of time the processing module 230 acquires the following values:

a value of the drain source voltage $V_{ds}$ ($t_i$) across the transistor EC1 at time $t_i$ measured by the measurement module 210;

a value of the ambient temperature Ta($t_i$) measured at time $t_i$ by the temperature sensor 410 mounted on the printed circuit board 400, prestored parameters including the thermal resistance Rth1 and thermal capacitance Cth1 of the material responsible for heat transfer from the die part D of the transistor EC1 to the printed circuit board PCB 400, a cumulated or global temperature variation $dT_{1,i-1}$ of the transistor EC1 relative to the ambient temperature Ta estimated at the previous iteration of time $t_{i-1}$, the current value $I_2(t_i)$, and/or the averaged current value $\tilde{I}_2$ ($t_i$), determined for the shunt EC2.

Since the transistor EC1 and the shunt EC2 are connected in series, the current $I_2$ through the shunt EC2 corresponds to the drain source current $I_{ds}(t_i)$ flowing through the transistor EC1. In other words:

$$I_2(t_i) = I_{ds}(t_i) \tag{17}$$

$$\tilde{I}_2(t_i) = \widetilde{I_{ds}}(t_i) \tag{18}$$

In the processing step S2_EC1, at each time the processing module 230 processes the input data using the thermal model. The processing includes the steps S20_EC1 to S27_EC1 described below.

In the step S20_EC1, the processing module 230 estimates an electrical power $P_1(t_i)$ dissipated by the transistor EC1 based on the measured value of the drain source voltage $V_{ds}(t_i)$ across the transistor EC1 and the value of the current $I_2(t_i)$ or $\tilde{I}_2$ ($t_i$) through the shunt EC2, corresponding to the drain source current $I_{ds}$ estimated at the iteration of time using the following equation:

$$P_1(t_i) = V_{ds}(t_i) \cdot I_2(t_i) \text{ or } P_1(t_i) = V_{ds}(t_i) \cdot \tilde{I}_2(t_i) \tag{19}$$

In the step S21_EC1, the processing module 230 estimates a value $\Delta T_{1,i}$ of incremental temperature variation of the transistor EC1 relative to the ambient temperature Ta over the current time step dt, between times $t_i$ and $t_{i+1}$, based on the thermal model, using the following equation derived from the equation (4):

$$\Delta T_{1,i} = \frac{dt}{Cth_1} \cdot \left( P_1(t_i) - \frac{-dT_{1,i-1}}{Rth_1} \right) \tag{20}$$

In the step S22_EC1, the processing module 230 may estimate a value $dT_{1,i}$ of temperature difference of the transistor EC1 relative to the ambient temperature Ta. For that purpose, the processing module 230 may compute the cumulated temperature variation between the initial time to and the current time by adding $\Delta T_{1,i}$ to the value of temperature difference $dT_{1,i-1}$ of the transistor EC1 relative to the ambient temperature Ta determined at the previous iteration of time $t_{i-1}$, based on the equation (5).

In the step S23_EC1, the processing module 230 may estimate the temperature of the transistor EC1 based on the ambient temperature Ta($t_i$) measured by the sensor 410 and the value of temperature difference $dT_{1,i}$ with the following equation derived from the equation (6):

$$T_1(t_i) = Ta(t_i) + dT_{1,i} \tag{21}$$

In the step S24_EC1, the processing module 230 estimates the value of the electrical drain source resistance $R_{ds}$ of the transistor EC1 at time $t_i$, based on the following equation:

$$R_{ds}(t_i) = \frac{V_{ds}(t_i)}{I_{ds}(t_i)} = \frac{V_{ds}(t_i)}{I_2(t_i)} \text{ or } \frac{V_{ds}(t_i)}{\tilde{I}_2(t_i)} \tag{22}$$

At each iteration of time $t_i$, a monitoring step S3_EC1 may then be performed to monitor the reliability of the transistor EC1 based on the output of the processing step S2. For example, the diagnostic module 240 may perform at least one of the following monitoring actions:

compare the temperature $T_1(t_i)$ of the transistor EC1 to a predetermined maximal temperature $T_{1max}$ of the transistor EC1;

compare the temperature difference $dT_{1,i}$ to a threshold value $dT_{1max}$ to a predetermined maximal temperature variation, or maximal transient temperature, between the transistor EC1 and the printed circuit board PCB 400;

compare the transistor resistance value $R_{ds}(t_i)$ to a predetermined maximal resistance value $R_{dsmax}$, when the transistor EC1 is fully conducting, in other words when the current $I_{ds}$ is above a minimal current value $I_{dsmin}$.

If the temperature $T_1(t_i)$ of the transistor EC1 is above $T_{1max}$, or the temperature difference $dT_{1,i}$ is above $dT_{1max}$, or the transistor resistance value $R_{ds}(t_i)$ is above $R_{dsmax}$, the diagnostic module 240 generates control signal for turning off the transistor EC1 and/or generating an alert signal.

With the present disclosure, the temperature of the transistor EC1 can be monitored, and if it is too high, the transistor EC1 may be turned off. The transient temperature, that is the difference or variation between the die temperature of the transistor EC1 and the temperature measured on the printed circuit board PCB 400, can also be monitored. If the transient temperature is too high, the transistor EC1 may also be turned off. Indeed, an important transient temperature is likely to produce stress on the transistor EC1. The drain source resistance $R_{ds}$ of the transistor EC1 can also be monitored, when the transistor EC1 is fully conducting. If the resistance $R_{ds}$ is too high, the transistor EC1 may be turned off too.

Alternatively, the diagnostic module 240 generates an alert signal warning that the transistor EC1 may have an abnormality and may not be reliable.

Figure 6:
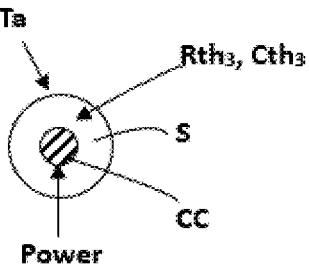
FIG. 6 schematically represents an electrical cable of the system of FIG. 1.

The cable EC3 connects the shunt EC2 on the printed circuit board 400 and the load 300 that is external to the printed circuit board 400. The cable EC3 is external to the printed circuit board 400. FIG. 6 schematically illustrates an example of model for the cable EC3: it includes a core cable CC in copper surrounded by an insulation layer or sleeve S. In operation, the core cable CC is provided with a certain electrical power and, due to power loss, heat is transferred from the core cable CC to the external surface of the cable EC2 where the temperature is equal to an ambient temperature Ta in the external environment surrounding the cable EC3.

In an embodiment, the ambient temperature Ta around the cable EC3 is not measured. In the process of monitoring the cable EC3, it is assumed that the ambient temperature Ta is equal to a maximal ambience temperature Ta_max that is expected in the environment surrounding the cable EC3. For example, let's consider that the system 100 is implemented in a vehicle. A maximal temperature in the vehicle can be predetermined. In an illustrative and non-limitative example, the expected maximal ambient temperature in the vehicle is equal to 80° (e.g., Ta_max=80° C.).

The iterative process including the steps S1 and S2 executed for the cable EC3 are described below.

In the acquisition step S1_EC3, at each iteration of time the processing module 230 acquires the following values:

the current value $I_2(t_i)$, and/or the averaged current value $\tilde{I}_2(t_i)$, determined for the shunt EC2; in the step S2_EC2;

a cumulated or global temperature variation $dT_{3,i-1}$ of the cable EC3 relative to the ambient temperature Ta around the cable EC3, estimated at the previous iteration of time $t_{i-1}$;

a value $R_3(t_{i-1})$ of an electrical resistance of the cable EC3 estimated at the previous iteration of time prestored parameters including the expected maximal ambient temperature Ta_max in the environment surrounding the cable EC3, the thermal resistance Rth3 and thermal capacitance Cth3 of the material responsible for heat transfer from the core cable CC of the cable EC3 to the external surface of the cable EC3, a reference value $R_{ref,3}$ of the electrical resistance of the cable EC3 at room or reference temperature $T_0$ of 20° C., a temperature coefficient $\alpha_3$ of the cable EC3.

Since the transistor EC1, the shunt EC2, the cable EC3 and the load 300 are connected in series, the current $I_2$ through the shunt EC2 corresponds to the current flowing through the cable EC3.

In the processing step S2_EC3, at each time the processing module 230 processes the input data using the thermal model. The processing includes the steps S20_EC3 to S27_EC3 described below.

In the step S20_EC3, the processing module 230 estimates an electrical power dissipated by the cable EC3 based on the value of the current $I_2(t_i)$, or $\tilde{I}_2(t_i)$, measured or estimated through the shunt EC2 and the value of the electrical resistance of the cable EC3 estimated at the previous iteration of time $t_{i-1}$, using one of the following equations:

$$P_3(t_i)=I_2(t_i))^2 \cdot R_3(t_{i-1}) \tag{23}$$

or $$P_3(t_i)=\tilde{I}_2(t_i))^2 \cdot R_3(t_{i-1}) \tag{24}$$

At the initial time $t_0$, the value of the electrical resistance of the cable EC3 may be set to the reference resistance value $R_{ref,3}$ of the cable EC3 at room temperature.

In the step S21_EC3, the processing module 230 estimates a value $\Delta T_{3,i}$ of incremental temperature variation of the cable EC3 relative to the ambient temperature Ta over the current time step dt, between times $t_i$ and $t_{i+1}$, based on the thermal model, using the following equation derived from the equation (4):

$$\Delta T_{3,i} = \frac{dt}{Cth_3} \cdot \left( P_3(t_i) - \frac{-dT_{3,i-1}}{Rth_3} \right) \tag{25}$$

In the step S22_EC3, the processing module 230 may estimate a value $dT_{3,i}$ of temperature difference of the cable EC3 relative to the ambient temperature Ta between the initial time to and the current time $t_i$. For that purpose, the processing module 230 may compute the cumulated temperature variation by adding $\Delta T_{3,i}$ to the value of the temperature difference $dT_{3,i-1}$ of the cable EC3 relative to the ambient temperature Ta determined at the previous iteration of time $t_{i-1}$, based on the equation (5).

In the step S24_EC3, the processing module 230 estimates the value of the electrical resistance of the cable EC3 at time $t_i$, based on the following equation:

$$R_3(t_i)=R_{ref,3}+\alpha_3 \cdot (Ta\_max+dT_{3,i}-20) \tag{26}$$

A step S3_EC3 of monitoring the reliability of the cable EC3 based on the output of the processing step S2_EC3 may be performed for the cable EC3. For example, the diagnostic module 240 may compare the temperature difference $dT_{3,i}$ to a predetermined maximal temperature increase of the cable EC3, so as to detect an abnormality in the system 100.

The monitoring device 200 and the system 100 can be included in a vehicle.

The present disclosure also concerns a computer program including instructions which, when the program is executed by a processor, cause the processor to carry out the steps of the method previously described.

Alternatively, the present method can be implemented only with hardware. The present disclosure also concerns a monitoring device configured to monitor reliability of the electrical components of the system 100, including only hardware means adapted to perform the steps of the method previously defined. The monitoring device may be for example by a digital state machine.

The term non-transitory computer-readable medium does not encompass transitory electrical or electromagnetic signals propagating through a medium (such as on a carrier wave). Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The phrase "at least one of A, B, and C" should be construed to mean a logical (A OR B OR C), using a non-exclusive logical OR, and should not be construed to mean "at least one of A, at least one of B, and at least one of C." The phrase "at least one of A, B, or C" should be construed to mean a logical (A OR B OR C), using a non-exclusive logical OR.

The invention claimed is:

1. A method of monitoring reliability of a system including a plurality of electrical components, the method comprising:

for each electrical component of the plurality of electrical components:

receiving input data including at least two of: a voltage across the electrical component, a current through the electrical component, and an electrical resistance value of the electrical component, and processing the input data using a stored thermal model representing heat transfer for the electrical component to determine a temperature difference of the electrical component relative to a reference temperature, wherein the heat transfer refers to heat flow between a first point of the electrical component, where a temperature is to be estimated, and a second point at the reference temperature;

monitoring the reliability of the system based on output data of the processing;

comparing output data from processing the input data with a threshold value to detect an abnormality in the system; and in response to detecting the abnormality in the system, turning off at least one electrical component of the plurality of electrical components, wherein the processing is first performed for a first electrical component of the plurality of electrical components and includes estimating an electrical current value based on the determined temperature difference of the first electrical component, and wherein the processing is then performed for a second electrical component of the plurality of electrical components using the estimated electrical current value as input data.

2. The method of claim 1 wherein processing the input data includes estimating an electrical power dissipated by the electrical component.

3. The method of claim 1 wherein:

receiving the input data further includes retrieving from memory a stored maximal ambient temperature that is expected near the electrical component; and the method includes determining the reference temperature based on the stored maximal ambient temperature.

4. The method of claim 1 wherein:

a sensor and the electrical component are mounted on a printed circuit board (PCB);

receiving the input data includes receiving a measured temperature from the sensor; and the method includes determining the reference temperature based on the measured temperature.

5. The method of claim 1 wherein:

receiving and processing the input data are performed iteratively to determine, at each iteration, a value of an incremental temperature variation of the electrical component relative to the reference temperature, over a time step; and processing the input data includes accumulating successive values of incremental temperature variation to estimate a value of the temperature difference.

6. The method of claim 5 further comprising estimating, at each iteration, an electrical resistance value of the electrical component based on the reference temperature and the estimated value of the temperature difference.

7. The method of claim 6 wherein the estimated value of the electrical resistance is used as input data at an immediately subsequent iteration in processing the input data to determine the temperature difference of the electrical component.

8. The method of claim 6 wherein processing includes estimating, at each iteration, an electrical current value flowing through the electrical component from a measured voltage value across the electrical component and the estimated electrical resistance value.

9. The method of claim 1 wherein turning off at least one electrical component of the plurality of electrical components selectively includes turning off the system.

10. A non-transitory computer-readable medium comprising instructions that, when executed by at least one processor, cause the at least one processor to:

for each electrical component of a plurality of electrical components of a system:

receive input data including at least two of a voltage across the electrical component, a current through the electrical component, and an electrical resistance value of the electrical component, and process the input data using a stored thermal model representing heat transfer for the electrical component to determine a temperature difference of the electrical component relative to a reference temperature, wherein the heat transfer refers to heat flow between a first point of the electrical component, where a temperature is to be estimated, and a second point at the reference temperature;

monitor reliability of the system based on output data of the processing;

compare output data from processing the input data with a threshold value to detect an abnormality in the system; and in response to detecting the abnormality in the system, turn off at least one electrical component of the plurality of electrical components, wherein the processing is first performed for a first electrical component of the plurality of electrical components and includes estimating an electrical current value based on the determined temperature difference of the first electrical component, and wherein the processing is then performed for a second electrical component of the plurality of electrical components using the estimated electrical current value as input data.

11. The non-transitory computer-readable medium of claim 10 wherein turning off at least one electrical component of the plurality of electrical components selectively includes turning off the system.

12. A monitoring device configured to monitor reliability of a system including a plurality of electrical components, the monitoring device comprising:

a memory configured to store instructions; and at least one processor configured to execute the instructions, wherein the instructions include:

for each electrical component of the plurality of electrical components:

receiving input data including at least two of a voltage across the electrical component, a current through the electrical component, and an electrical resistance value of the electrical component, and processing the input data using a stored thermal model representing heat transfer for the electrical component to determine a temperature difference of the electrical component relative to a reference temperature, wherein the heat transfer refers to heat flow between a first point of the electrical component, where a temperature is to be estimated, and a second point at the reference temperature;

monitoring the reliability of the system based on output data of the processing;

comparing output data from processing the input data with a threshold value to detect an abnormality in the system; and in response to detecting the abnormality in the system, turning off at least one electrical component of the plurality of electrical components, wherein the processing is first performed for a first electrical component of the plurality of electrical components and includes estimating an electrical current value based on the determined temperature difference of the first electrical component, and wherein the processing is then performed for a second electrical component of the plurality of electrical components using the estimated electrical current value as input data.

13. The monitoring device of claim 12 wherein turning off at least one electrical component of the plurality of electrical components selectively includes turning off the system.

14. A vehicle comprising the monitoring device of claim 12.

* * * * *